United States Patent
Blatchford

(10) Patent No.: US 9,112,000 B2
(45) Date of Patent: Aug. 18, 2015

(54) METHOD FOR ENSURING DPT COMPLIANCE FOR AUTO-ROUTED VIA LAYERS

(71) Applicant: Texas Instruments Incorporated, Dallas, TX (US)

(72) Inventor: James Walter Blatchford, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 236 days.

(21) Appl. No.: 13/622,949

(22) Filed: Sep. 19, 2012

(65) Prior Publication Data
US 2013/0072020 A1 Mar. 21, 2013

Related U.S. Application Data

(60) Provisional application No. 61/536,322, filed on Sep. 19, 2011.

(51) Int. Cl.
*G06F 17/50* (2006.01)
*H01L 21/768* (2006.01)

(52) U.S. Cl.
CPC .... *H01L 21/76813* (2013.01); *H01L 21/76816* (2013.01); *G06F 17/5077* (2013.01); *G06F 17/5081* (2013.01)

(58) Field of Classification Search
CPC H01L 23/481; H01L 23/528; G06G 2217/12; G06F 17/5077; G03F 7/70433
USPC ............................ 716/55, 119, 122, 126, 130
See application file for complete search history.

(56) References Cited

U.S. PATENT DOCUMENTS

| | | | |
|---|---|---|---|
| 8,381,139 B2* | 2/2013 | Lin et al. | 716/52 |
| 8,598,712 B2* | 12/2013 | Huang et al. | 257/773 |
| 2011/0004858 A1* | 1/2011 | Chang et al. | 716/122 |

* cited by examiner

*Primary Examiner* — Sun Lin
(74) *Attorney, Agent, or Firm* — Jacqueline J. Garner; Frank D. Cimino

(57) ABSTRACT

A method of generating an integrated circuit with a double patterning technology (DPT) compatible via pattern using a reduced DPT compatible via design rule set. A reduced DPT compatible via design rule set. A method of forming an integrated circuit using a via pattern generated from a reduced DPT compatible design rule set.

6 Claims, 11 Drawing Sheets

METHOD FOR ENSURING DPT COMPLIANCE FOR AUTO-ROUTED VIA LAYERS

This application claims the benefit of priority and incorporates by reference U.S. Provisional Application 61/536,322, filed Sep. 19, 2011.

The following patent applications are related and hereby incorporated by reference: U.S. patent application Ser. No. 13/622,935, filed Sep. 19, 2012 (now U.S. Pat. No. 8,756,550 issued Jun. 17, 2014, and U.S. patent application Ser. No. 13/622,937, filed Sep. 19, 2012 (now U.S. Pat. No. 8,707,223 issued Apr. 22, 2014.

FIELD OF THE INVENTION

This invention relates to the field of integrated circuits. More particularly, this invention relates to double patterning photolithograph processes for forming integrated circuits.

BACKGROUND

Integrated circuits may be formed using photolithography processes with illumination sources having wavelengths more than twice a desired pitch of metal interconnect lines in the integrated circuits. Attaining desired tradeoffs between fabrication costs and fabrication yield may be difficult. For example, standard single photoresist patterns begin to blur at about the 45 nm feature size and 100 nm pitch (feature size plus space between features) when printing with 193 nm wavelength light.

Double patterning technology (DPT), illustrated in FIGS. 1A-1B, may be used to print patterns with a pitch (geometry width plus space width) that is tighter than can be printed with a single exposure. The pattern in FIG. 1A is composed of the metal1 pattern in FIG. 1B, the via 1 pattern in FIG. 1C and the metal2 pattern in FIG. 1D. In DPT technology, as shown FIG. 1B the metal 1 interconnect pattern with a tight single exposure pitch 20 may be decomposed into two photomasks with alternating interconnect rows DPT-M1-A on one DPT photomask with relaxed pitch 22 and alternating interconnect rows DPT-M1-on a second DPT photomask with relaxed pitch 24. For example, a pattern with 100 nm pitch which prints blurred when all geometries are placed on a single photo mask may be decomposed into two DPT photo masks each with a 200 nm pitch which print without blurring.

As shown in FIG. 1C, unlike the metal 1 pattern which has a tight pitch 20 in only the vertical direction, the via pattern has a tight pitch in both the x 34 and the y 36 directions. To print tight pitches in both the x and the y directions would require generating DPT photomasks with reduced pitch in both directions and so would require the generation of 4 DPT photomasks, one with geometries 26, one with geometries 28, one with geometries 30, and one with geometries 32 as shown in FIG. 1C. This is very expensive. In addition, each photomask is aligned separately each with an alignment error. With two DPT photomasks there are two alignment errors. With four photomasks there would be 4 alignment errors significantly increasing yield loss.

As shown in FIG. 2, the photomask for via pattern 30 may have alignment errors in the negative x and positive y directions and the photomask for via pattern 32 may have an alignment error in the positive x direction. Via misalignment may significantly decrease the contact area, 34 and 36, between the via and the underlying metal 1 and between the via and the overlying metal 2 increasing the via resistance and significantly reducing yield.

SUMMARY

A method of generating an integrated circuit with a DPT compatible via pattern using a reduced DPT compatible via design rule set. A reduced DPT compatible via design rule set. A method of forming an integrated circuit using a via pattern generated from a reduced DPT compatible design rule set.

DETAILED DESCRIPTION OF EXAMPLE EMBODIMENTS

Methods that ensure an integrated circuit via layout is double pattern technology (DPT) compatible and is autoroutable are often computationally intensive and may require significant manual relayout to resolve color conflicts increasing cost. Techniques that are not computationally intensive usually result in significantly larger area which also increases cost.

The embodiments described below present methods to ensure DPT compatible via patterns in an integrated circuit that may be autorouted using EDA tools without excessive computation and without an excessive increase in pattern area.

In an embodiment DPT compatible method a relatively simple set of DPT compatible via design rules (DR) is input into an electronic design automation (EDA) tool such as "IC COMPILER"™ sold by Synopsis, Inc. of Mountain View, Calif., which may also include a router such as "ZROUTE"™, also sold by Synopsis. Other EDA tools may also be used, such as "VIRTUOSO" custom design platform, or the "ENCOUNTER" digital IC design platform along with the "VIRTUOSO" chip assembly router all sold by Cadence Design Systems, Inc., of San Jose, Calif. The EDA tool is special purpose computer software program that may be loaded onto a general purpose processor and with design rule input data and netlist data, perform routing of an integrated circuit and generate interconnect and via patterns.

A relatively simple set of embodiment DPT compatible via design rules hereafter referred to as "reduced DPT via DR set" which ensures a via pattern is DPT compatible are listed in TABLE 1 and illustrated in FIGS. 3A-3E.

Figure 1A:
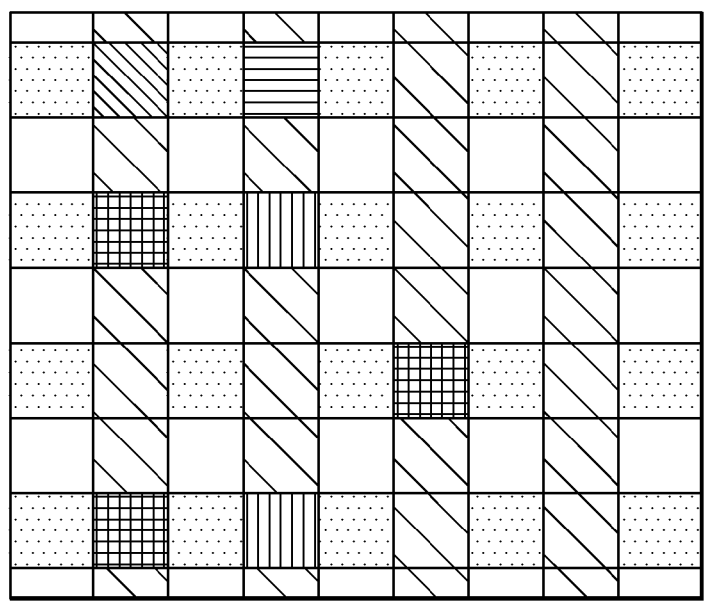
FIG. 1A-1D (Prior art) show an example of two interconnect patterns with orthogonal patterns connected by a via pattern.
Figure 1B:
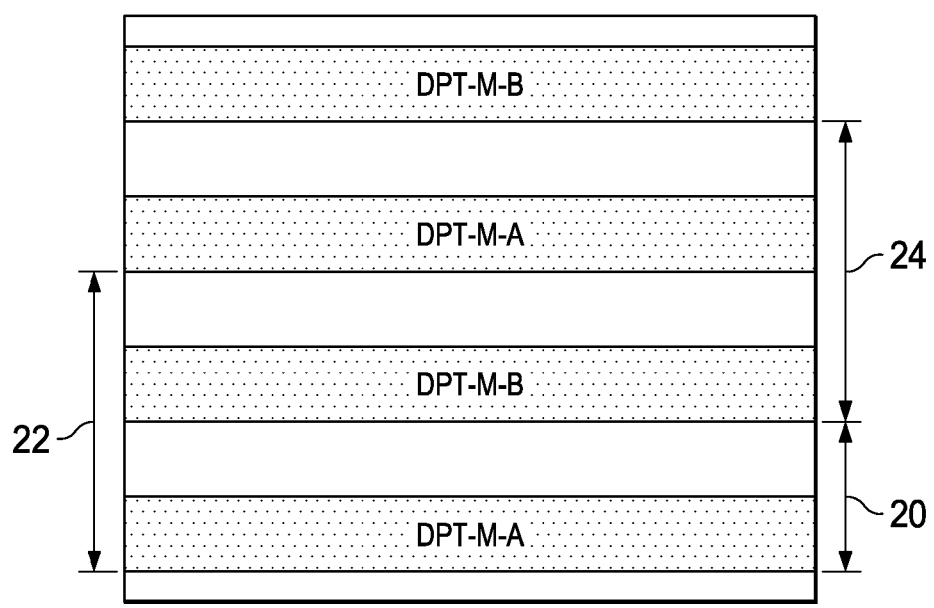
Figure 1C:
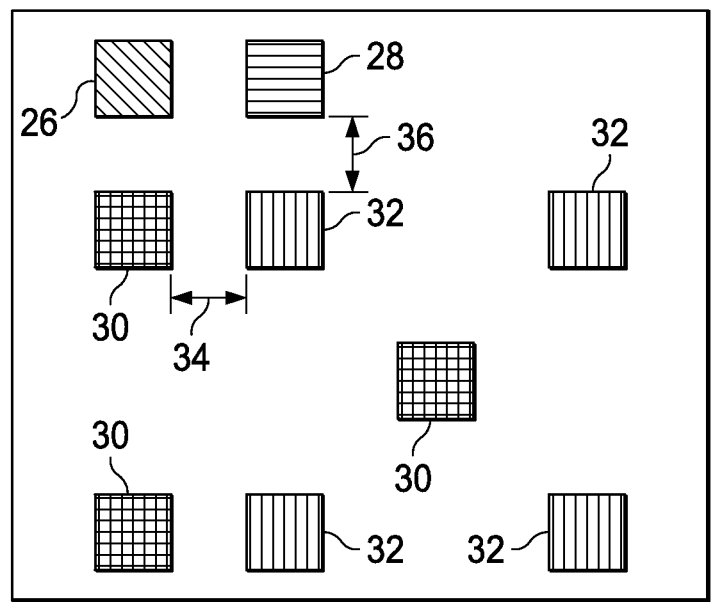
Figure 1D:
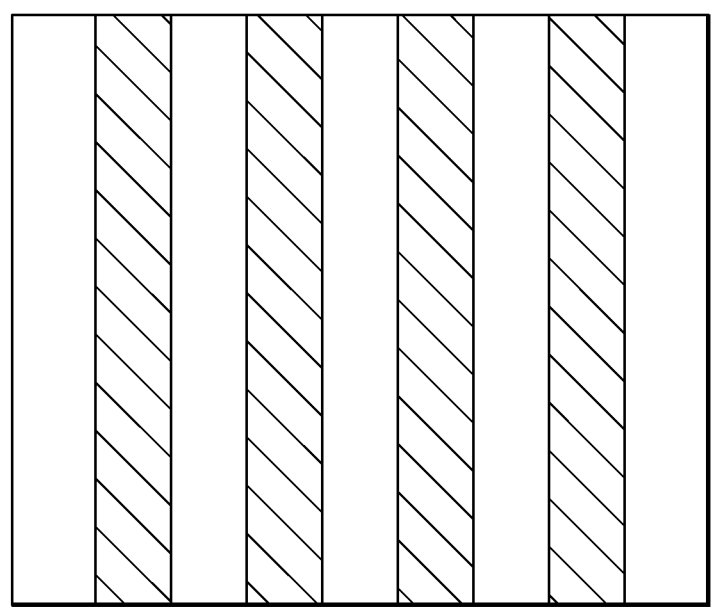
Figure 2:
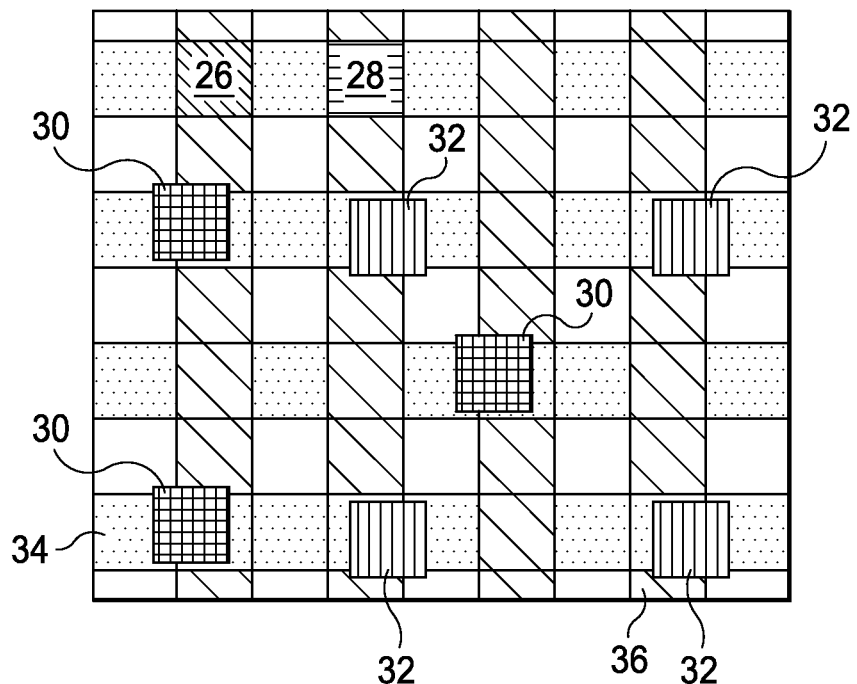
FIG. 2 (Prior art) illustrates problems that may be caused by misalignment of via patterns.
Figure 3A:
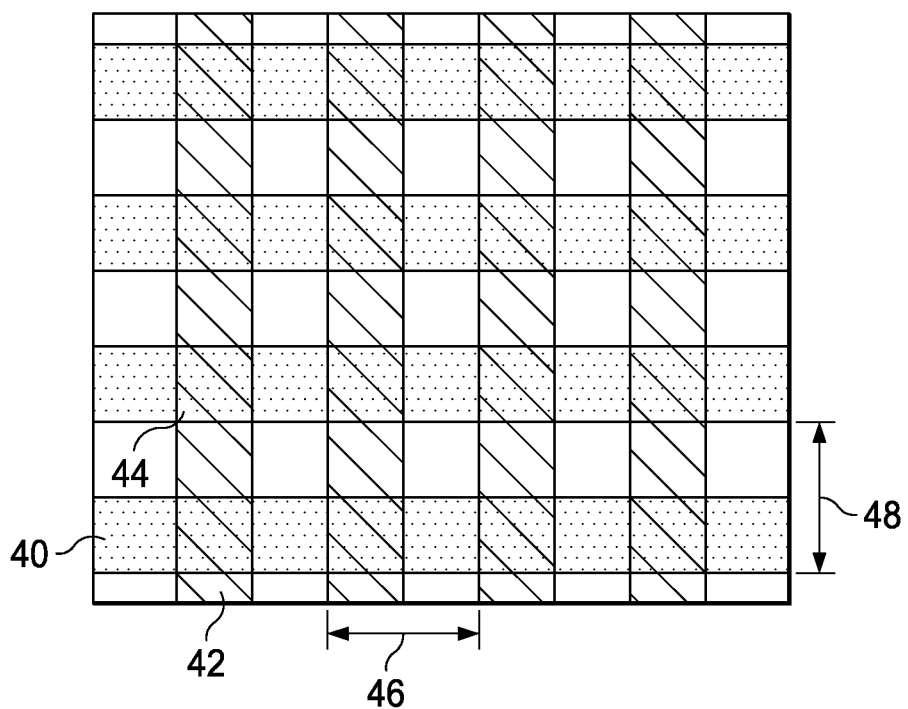
FIGS. 3A-3C illustrate the layout of a via pattern using an embodiment reduced DPT compatible design rule set according to principles of the invention.
Figure 3B:
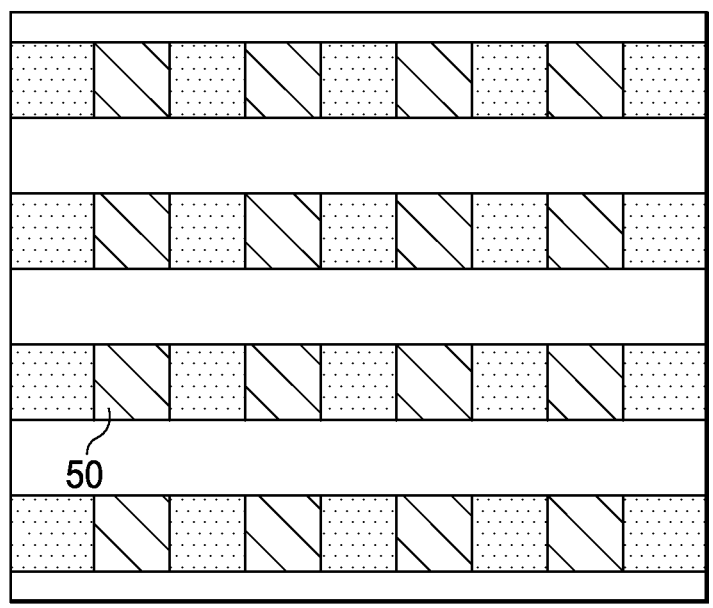

Reduced DPT compatible via design rule 1 in Table 1 states that vias are laid out on a fixed grid which is defined by the intersection of the underlying interconnect and the overlying interconnect patterns. This rule is illustrated in FIGS. 3A and 3B. The preferred direction of underlying interconnect pattern 40 is horizontal. The preferred direction of overlying interconnect pattern 42 is vertical. The intersections 44 of underlying interconnect 40 lying in the preferred horizontal direction and overlying interconnect 42 lying in the preferred vertical direction forms a grid 50 as shown in FIG. 3B. It is on this grid that the vias are to be laid out according to the reduced DPT compatible design rule 1.

TABLE 1

1. Via layout on a fixed grid formed by the intersection of underlying and overlying interconnect.
2. Via shape is rectangular with the major axis aligned parallel with the preferred direction of the underlying interconnect.
3. Minimum via pitch in preferred direction of underlying metal is approximately twice the pitch of the overlying interconnect.
4. Minimum via pitch in the non preferred direction is approximately the pitch of the underlying interconnect.
5. Via width in the preferred direction of underlying metal is at least the design rule width of the overlying metal plus at least two alignment tolerances in the preferred direction. (To ensure the etched via width in the preferred direction of the underlying interconnect is self aligned to the overlying interconnect pattern)

Figure 3C:
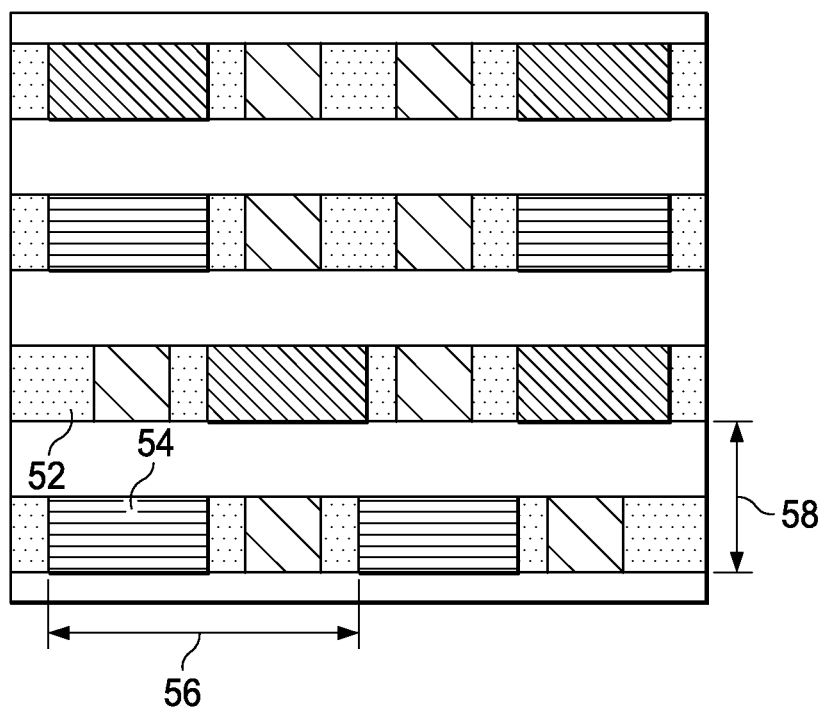

Reduced DPT compatible via design rule 2 in Table 1 states that via shape is rectangular with the major (longest) axis aligned parallel with the preferred direction of the underlying interconnect. As shown in FIG. 3C, rectangular vias 54 are aligned with the major axis parallel to the horizontal preferred direction of the underlying interconnect 40.

Reduced DPT compatible via design rule 3 in Table 1 states that the minimum via pitch in preferred direction of underlying metal is approximately twice the pitch of the overlying interconnect. As is illustrated in FIG. 3C, the minimum via pitch 56 in the preferred direction of the underlying metal 40 is approximately twice the pitch 46 of the overlying interconnect pattern 42 in FIG. 3A. Additional design rules to specify the via width and via space in the preferred direction may be added. In the example embodiment shown in FIG. 4 the width 64 and space 65 of the rectangular via in the preferred direction are approximately the same and approximately equal to the pitch (46 in FIG. 3A) of the overlying interconnect.

Reduced DPT compatible via design rule 4 in Table 1 states that the minimum via pitch in the non preferred direction of underlying interconnect is approximately the same as the underlying interconnect minimum pitch. As is illustrated in FIG. 3C, the minimum via pitch 58 in the non preferred direction of the underlying metal 40 is approximately the pitch 48 of the underlying interconnect pattern 40 in the non preferred (vertical) direction in FIG. 3A. Additional design rules to specify the via width and via space in the non preferred direction may be added. In the embodiment shown in FIG. 4 the width 61 and space 63 of the via in the non preferred direction are approximately the same and approximately equal to the non preferred direction width and space design rules of the underlying interconnect. To ensure misalignment of the via pattern in the nonpreferred direction does not reduce the contact area between the via and the underlying interconnect a via overhang of underlying interconnect design rule that is equal to or greater than the alignment tolerance in the non preferred direction may be added.

Reduced DPT compatible via design rule 5 in Table 1 states that the via width in the preferred direction of underlying metal is approximately equal to the design rule width of the overlying metal plus at least two alignment tolerances in the preferred direction. This design rule is explained using an embodiment process flow described with top down pattern views in FIGS. 5A-5E and corresponding cross sectional views in FIGS. 6A-6E.

Figure 6A:
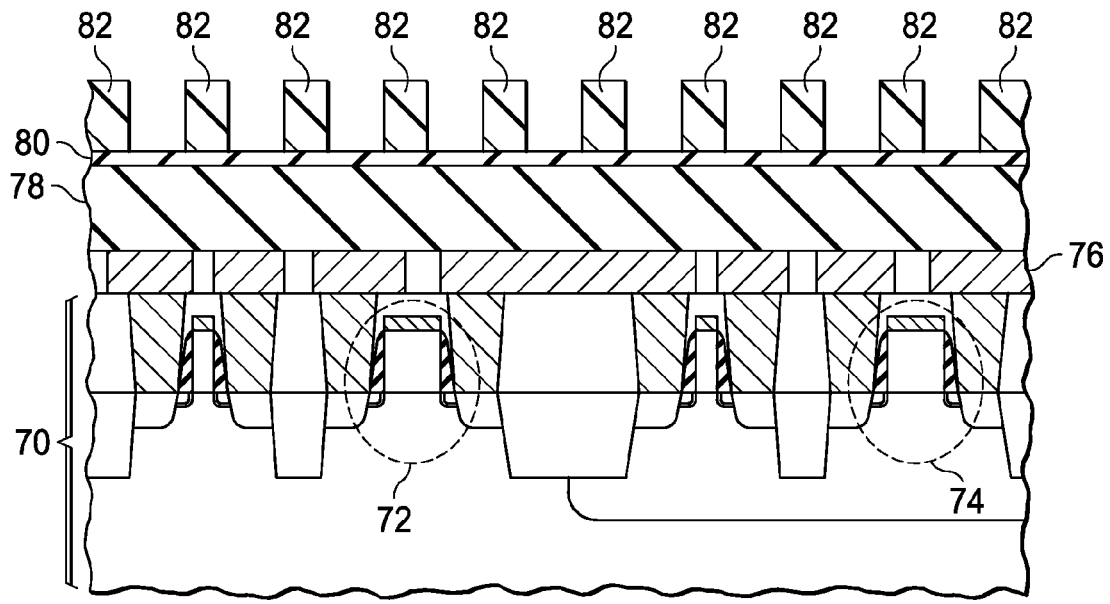
FIG. 6A-6E are cross sectional views of the formation of vias according to principles of the invention.

The cross section in FIG. 6A shows a portion of an integrated circuit 70 chip with NMOS 72 and PMOS 74 transistors. Overlying the integrated circuit 70 is a first layer of interconnect 76 (hereafter called metal1). Dielectric layer 78 which may be silicon dioxide, a low-k dielectric, silicon nitride or multiple layers of dielectric overlies the metal1 layer 76. A layer of hardmask material 80 overlies the dielectric layer 78. A second interconnect (hereafter called metal2) photoresist pattern 82 is formed on the hardmask material 80. As shown in the topdown view in FIG. 5A, the metal2 pattern forms non preferred direction (vertical) stripes of the metal2 pattern on the hardmask 80 in this embodiment example.

Figure 5A:
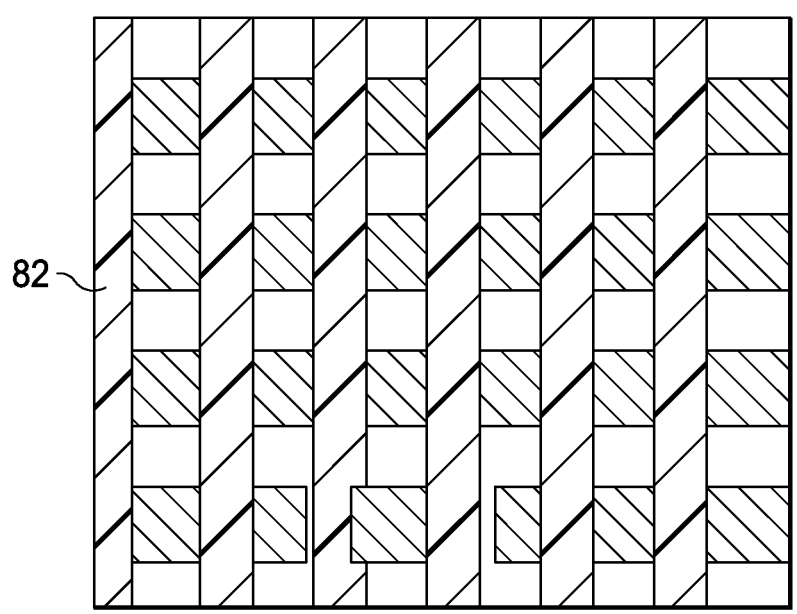
FIG. 5A-5E are top down views of the formation of vias according to principles of the invention.
Figure 5B:
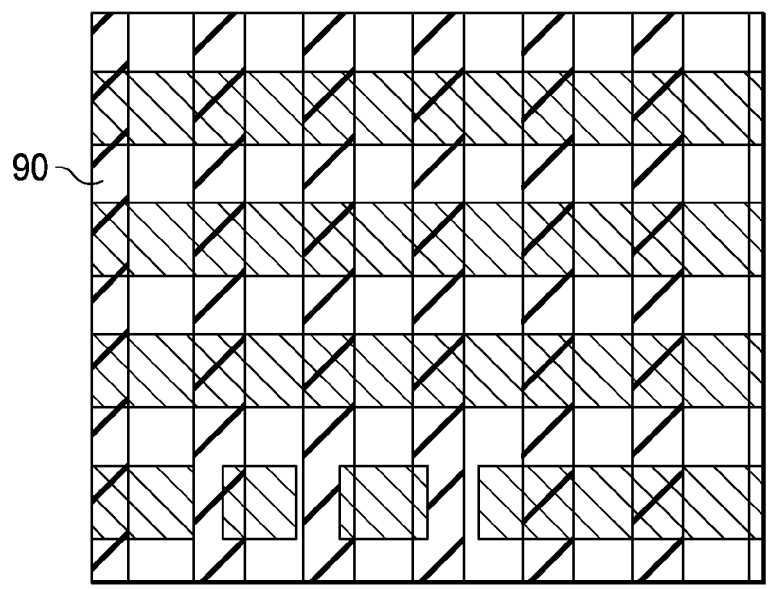
Figure 5C:
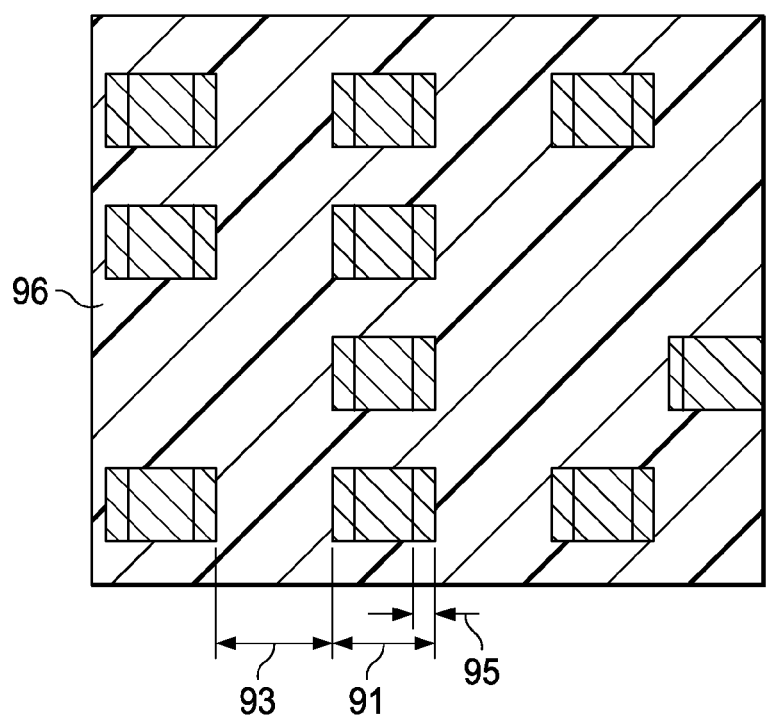
Figure 5D:
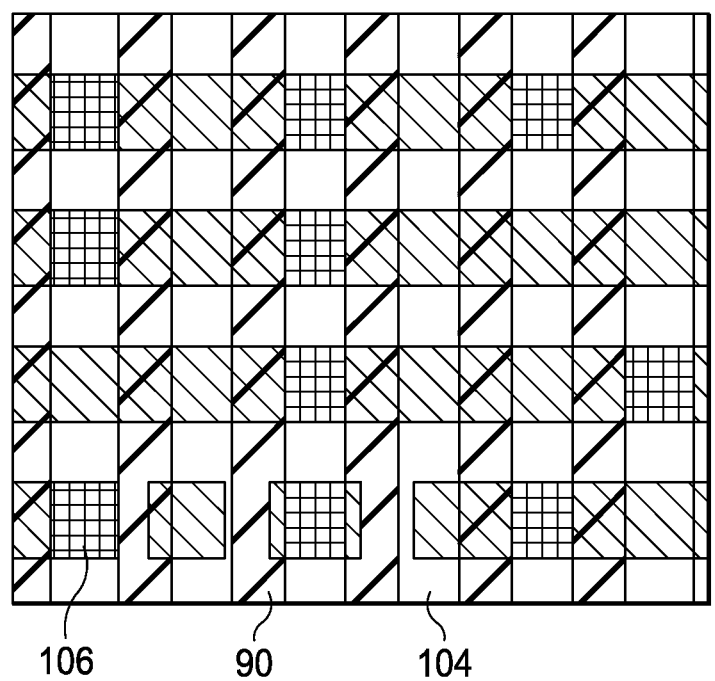
Figure 6B:
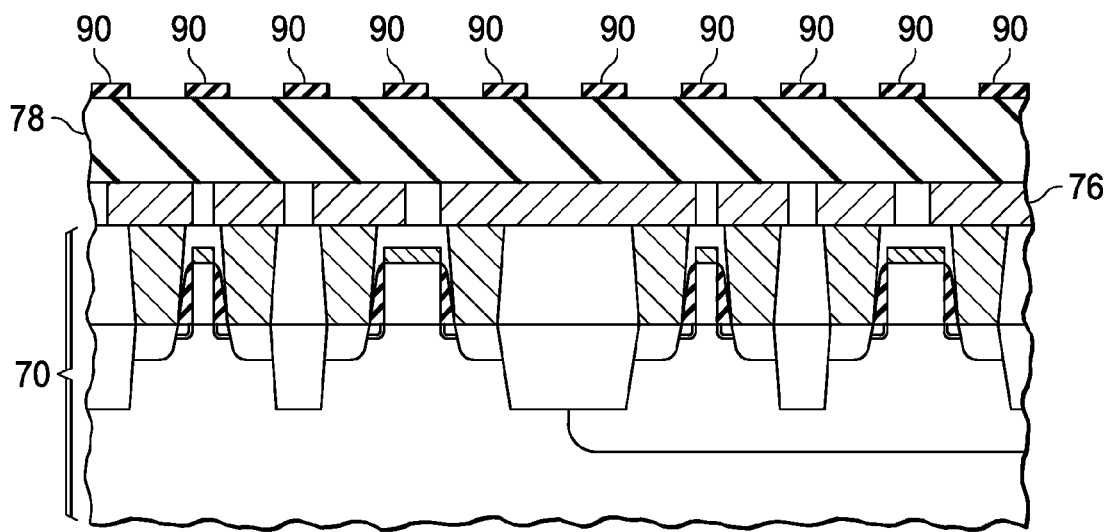

Referring now to the cross section in FIG. 6B, the metal2 pattern is etched into the hardmask material 80 and the metal2 photo resist pattern 82 is removed. As shown in FIG. 5B, vertical stripes 90 of hardmask material 80 are formed over the integrated circuit 70.

Figure 6C:
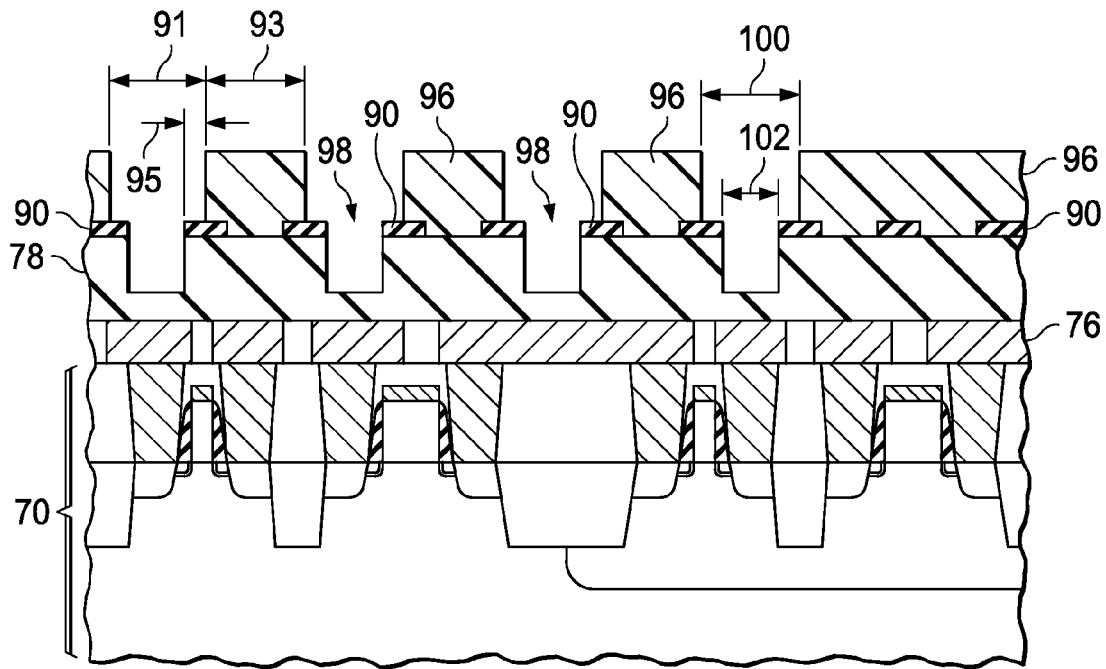

An embodiment via pattern 96 is formed on the integrated circuit 70 as shown in FIG. 6C The rectangular via openings in the preferred direction of metal1 are larger than the spacing between the vertical strips 90 of the hardmask material 80. Vias 98 are then partially etched into dielectric layer 78. The width of the via openings 102 in the preferred horizontal direction is not determined by the width of the via pattern opening 100. Instead, as directed by reduced DPT compativel via design rule 5 in Table 1, the width of the via 102 is self aligned to the metal2 hardmask pattern 90. Requiring the width of the via to be at least two alignment tolerances greater than the width of the overlying interconnect, ensures that the via width is self aligned to the hardmask pattern 90. As shown in the top down view of the embodiment via pattern in FIG. 5C, the rectangular via pattern overlaps 95 the metal2 patterned hardmask 90 on both sides by at least an alignment tolerance so that the horizontal width of the via opening 102 is determined by the opening in the metal2 hardmask 90 and is not determined by the width of the opening in the via pattern 100.

Figure 6D:
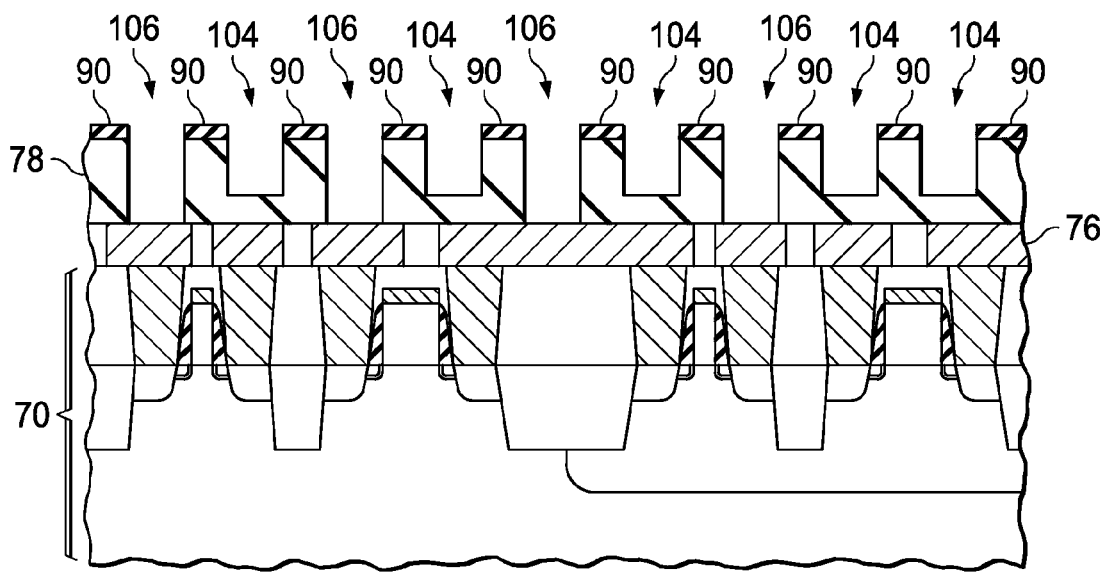

Referring now to FIG. 6D, the embodiment via pattern is removed and metal2 trenches 104 are etched into the dielectric 78. During etching of the metal2 trenches 104 the partially etched vias are additionally etched to open the vias 106 down to the underlying metal1. Since the vias are self aligned to the metal-2 pattern, no misalignment of the via can occur and thus reliability and yield issues caused by via to metal2 misalignment which may result in high via resistance are avoided.

Figure 5E:
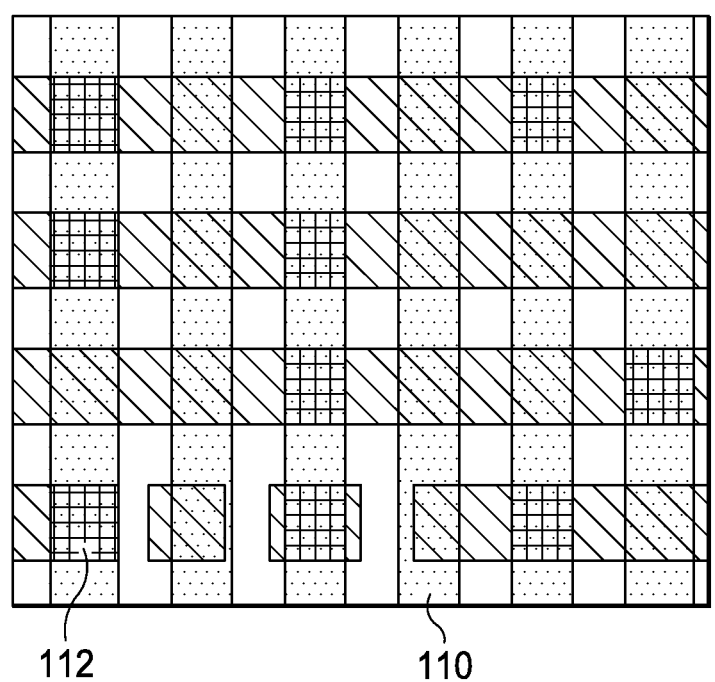
Figure 6E:
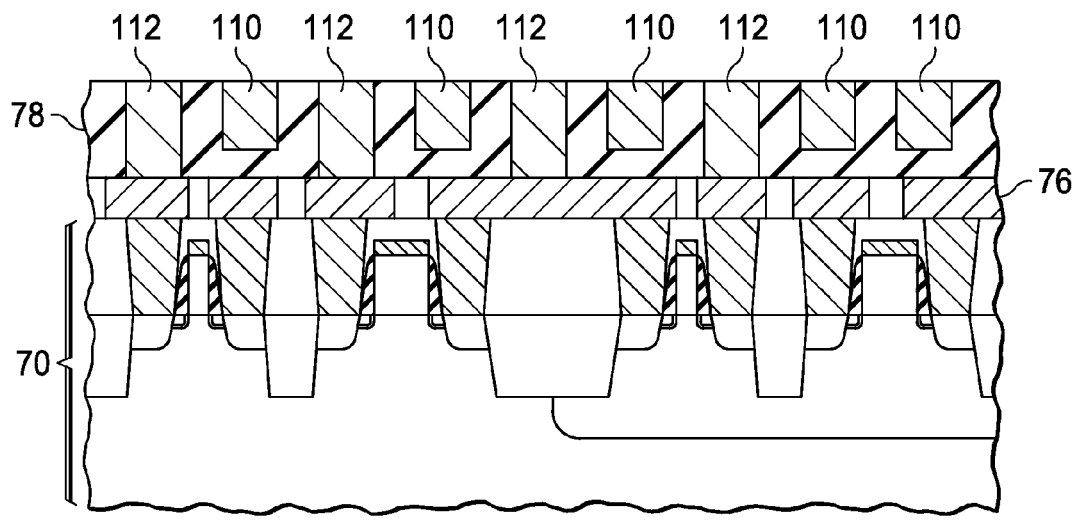

In FIG. 6E the metal2 trenches 110 and vias 112 are filled with metal2 and planarized. Typically this is accomplished using dual damascene copper. FIG. 5E is a top down view after the trenches 110 and vias 112 are filled with metal2.

Figure 4:
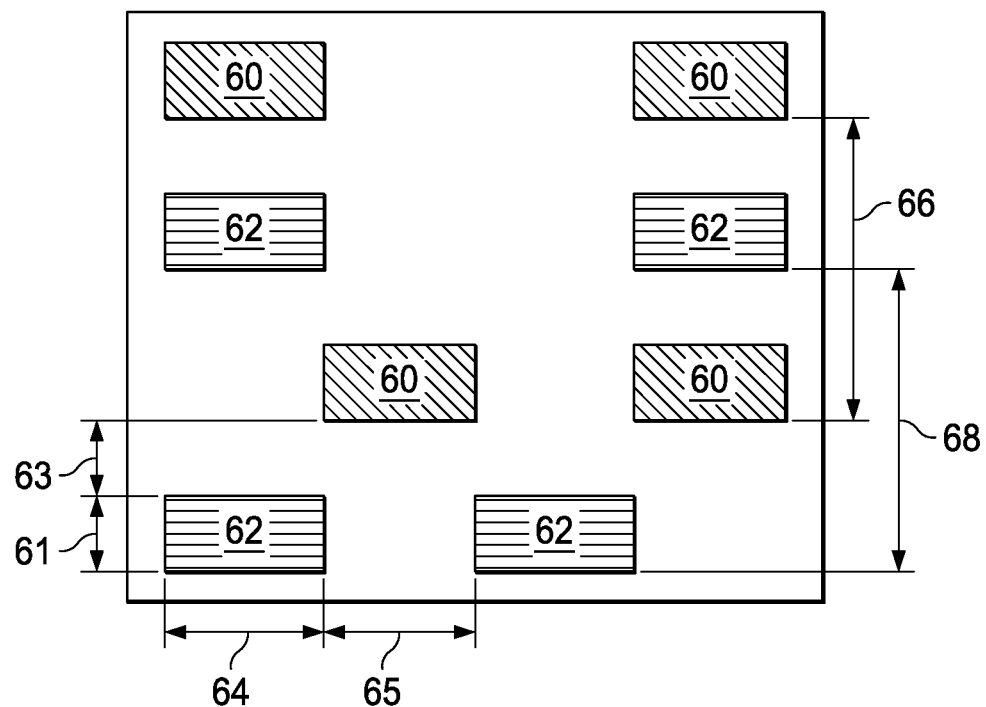
FIG. 4 illustrates that via patterns formed according to principles of the invention are DPT compatible.

As is demonstrated in FIG. 4, the embodiment autorouted via pattern 54 of FIG. 3A is DPT compatible by construction using the embodiment reduced DPT compatible via design rules listed in Table 1. Embodiment DPT compatible via pattern 54 may be separated into a first DPT mask 60 and a second DPT mask 62 by placing one set of alternate rows (even numbered rows) of vias on the first DPT via mask 60 and placing a second set of alternate rows (odd numbered rows) of vias on the second DPT via mask 62. The DPT decomposition process is especially facilitated if the underlying interconnect layer is also DPT compatible. If the underlying interconnect pattern is DPT compatible alternating interconnect rows are placed on two DPT interconnect photomasks. In this instance the corresponding vias on the alternating interconnect rows may also be placed on two corresponding DPT via photomasks. Each of the DPT compatible photomasks, 60 and 62, has a pitch, 66 and 68, which is approximately half the pitch 58 of the via pattern 54.

Figure 7:
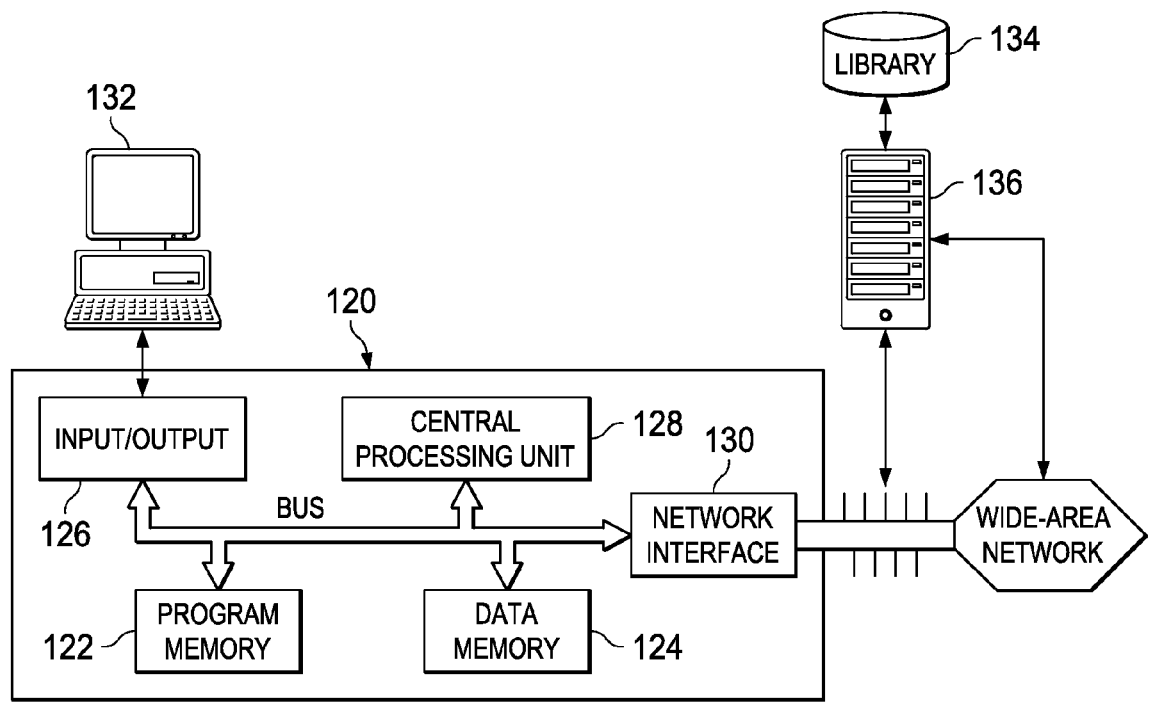
FIG. 7 is an electrical diagram, in schematic form, illustrating a computer system for generating DPT compatible via patterns in an integrated circuit according to principles of this invention.

FIG. 7 illustrates the construction of a system used to perform routing of integrated circuits and to generate integrated circuit interconnection patterns which are DPT compatible according to an embodiment of the invention. In this example, the DPT compatible interconnect pattern generation system is as realized by way of a computer system including workstation 120 connected to server 136 by way of a network through network interface 130. Of course, the particular architecture and construction of a computer system useful in connection with this invention can vary widely. For example, the DPT compatible routing system may be realized by a single physical computer, such as a conventional workstation or personal computer, or alternatively may be a computer system implemented in a distributed manner over multiple physical computers. Accordingly, the generalized architecture illustrated in FIG. 7 is provided by way of example only.

As shown in FIG. 7, workstation 120 includes central processing unit (CPU) 128, coupled to the system bus BUS. Also coupled to system bus BUS is input/output interface 126 which refers to those interface resources by way of which peripheral functions 132 (e.g., keyboard, mouse, display, etc.) communicate with the other constituents of workstation 120. CPU 128 refers to the data processing capability of workstation 120, and as such may be implemented by one or more CPU cores or co-processing circuitry. The particular construction and capability of central processing unit 128 is selected according to the application needs of workstation 120. In the architecture of layout modification system according to this example, program memory 122 and data memory 124 are coupled to the system bus BUS. The workstation 120 and server 136 may also be coupled to a library 134 which may store programs, data, and integrated circuit net lists and layout patterns such as interconnect layout patterns.

Figure 8:
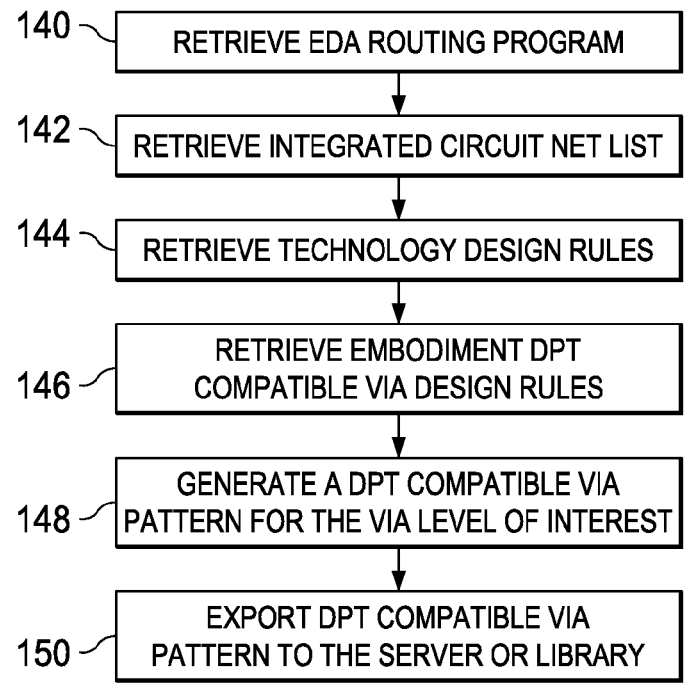
FIG. 8 is a flow diagram illustrating the operation of a computer system for generating DPT compatible via patterns in an integrated circuit according to principles of this invention.

FIG. 8 is a process flow diagram illustrating a method for generating a DPT compatible interconnect pattern according to embodiments. In step 140 of the diagram in FIG. 8, an EDA routing program such as "IC COMPILER"™ sold by Synopsis, Inc. of Mountain View, Calif. or "VIRTUOSO" chip assembly router sold by Cadence Design Systems, Inc., of San Jose, Calif. is loaded into the workstation 120. An operator may then input using an input device 132 such as a keyboard the name of the integrated circuit design, the target via level, and the paths to the required files such as the integrated circuit net list file and the design rule files. In steps 142, 144, and 146, the integrated circuit net list, the technology design rules, and the embodiment reduced DPT compatible via design rule set are read into the workstation 120.

In step 148 the EDA routing program then generates a DPT compatible via pattern with using the reduced DPT compatible via design rule set.

The DPT compatible via pattern may then be written to the server 136 or to library 134 in step 150. Alternatively, the DPT compatible interconnect pattern may be input directly into a DPT photo pattern generation program as is shown in FIG. 9.

In step 160 a DPT photo pattern generation program is loaded into the workstation 120 (FIG. 7).

Figure 9:
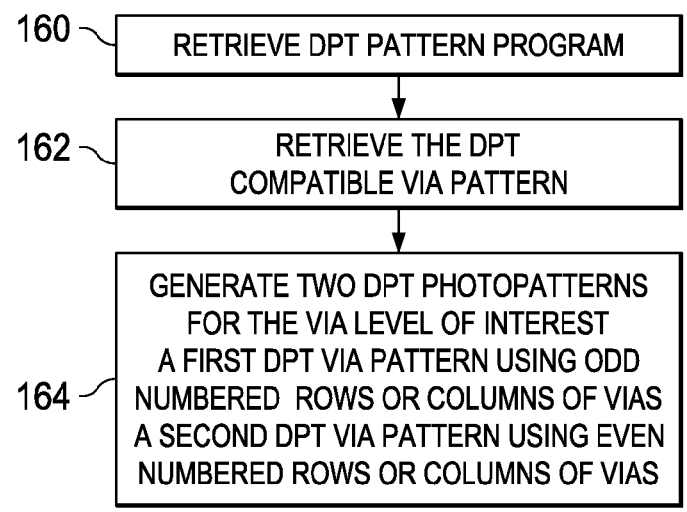
FIG. 9 is a flow diagram illustrating the operation of a computer system for generating DPT photo patterns for a via level of an integrated circuit according to principles of this invention.

The output of step 150 of FIG. 8 may be loaded into the workstation 120 in step 162 of FIG. 9.

Referring now to Step 164 in FIG. 9, two DPT via photo patterns are generated by the DPT photo pattern generation program. A first DPT via photo pattern is generated using odd numbered rows (or columns) of vias whose major axis is parallel with the preferred direction of the underlying interconnect. A second DPT via photo pattern is generated using even numbered rows (or columns) of vias whose major axis is parallel with the preferred direction of the underlying interconnect (horizontal or vertical). These two DPT via photo patterns may be used to produce two DPT photo masks. The DPT photomasks may be used to print a via pattern level for an integrated circuit with a pitch that is tighter pitch than is possible using a via single exposure via photomask. For example, in an example embodiment, the first DPT via photomask is printed in a photoresist and the second DPT via photomask is printed in the same photoresist layer. The photoresist is then developed forming openings where vias are to be formed. The via openings 98 are then partially etched into the underlying dielectric as shown in FIG. 6C. The via openings 98 are self aligned in the preferred underlying interconnect direction to the hardmask 90.

An EDA program using the embodiment reduced set of DPT compatible via layout rules may autoroute a via pattern that is DPT compatible without excessive computation time, without additional relayout, and without excessive area penalty.

Those skilled in the art to which this invention relates will appreciate that many other embodiments and variations are possible within the scope of the claimed invention.

What is claimed is:

1. A process of operating a computer system for forming an integrated circuit, comprising the following steps:
   loading an electronic design automation (EDA) routing program into said computer system;
   loading a net list of said integrated circuit into said computer system;
   loading a technology design rule set into said computer system;
   loading a reduced double patterning technology (DPT) compatible via design rule set into said computer system;
   selecting a via level of interest for said integrated circuit; and
   generating a DPT compatible via layout composed of geometries of rectangular via whose major axis is parallel with a preferred direction of an underlying interconnect using said EDA routing program with said reduced DPT compatible via design rule set.

2. The process of claim 1 further comprising the following steps:
   loading a DPT pattern generation program into said computer system;
   loading said DPT compatible via layout into said computer system;
   generating a first DPT via photopattern using odd numbered rows or columns of said rectangular vias where a major axis of said rectangular vias are all parallel; and
   generating a second DPT via photopattern using even numbered rows or columns of said rectangular vias where said major axis of said rectangular vias are all parallel.

3. The process of claim 2 further comprising the following steps:
- generating a first DPT photo-mask using said first DPT via photo-pattern;
- generating a second DPT photo-mask using said second DPT via photo-pattern
- printing a first via pattern in photo-resist over a hardmask etched with an overlying interconnect pattern using said first DPT via photomask where said hardmask overlies a dielectric layer and where said dielectric layer overlies underlying interconnect geometries;
- printing a second via pattern in said photoresist; and
- etching a portion of said dielectric layer to form via openings;
- removing said photoresist;
- etching trenches for said overlying interconnect pattern into said dielectric layer;
- additionally etching said via openings down to said underlying interconnect; and
- filling said trenches and said via openings with metal to form an overlying interconnect where said vias connect said overlying interconnect to said underlying interconnect geometries in said integrated circuit.

4. The process of claim 1 where said reduced DPT compatible via design rule set further includes:
- drawing vias on a fixed grid formed by an intersection of an underlying and overlying interconnect;
- drawing rectangular vias with a major axis of said rectangular vias aligned parallel with a preferred direction of said underlying interconnect;
- laying out said rectangular vias with a minimum pitch in said preferred direction of said underlying interconnect that is approximately twice of a pitch of said overlying interconnect;
- laying out said rectangular vias with a minimum pitch in a non-preferred direction of said underlying interconnect approximately equal to a pitch of said underlying interconnect in said non-preferred direction; and
- drawing a via width in said preferred direction of said underlying metal to be equal to a width of said overlying interconnect plus at least two alignment tolerances in said preferred direction of said underlying interconnect.

5. The process of claim 4 where said reduced DPT compatible via design rule set further includes:
- a via width in said preferred direction of said underlying interconnect approximately equal to said pitch of said overlying interconnect;
- a via space in said preferred direction of said underlying interconnect approximately equal to said pitch of said overlying interconnect;
- a via width in said non-preferred direction of said underlying interconnect approximately equal to a width of said underlying interconnect in said non-preferred direction; and
- a via space in said non-preferred direction of said underlying interconnect approximately equal to a space of said underlying interconnect in said non-preferred direction.

6. The process of claim 4 where a via width in said non-preferred direction of said underlying interconnect is approximately equal to a width of said underlying interconnect in said non-preferred direction plus at least two alignment tolerances in said non-preferred direction.

\* \* \* \* \*